(12) United States Patent
Weathers et al.

(10) Patent No.: US 8,484,519 B2
(45) Date of Patent: Jul. 9, 2013

(54) OPTIMAL PROGRAMMING LEVELS FOR LDPC

(75) Inventors: Anthony D. Weathers, San Diego, CA (US); Richard D. Barndt, San Diego, CA (US); Xinde Hu, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

(21) Appl. No.: 13/553,707

(22) Filed: Jul. 19, 2012

(65) Prior Publication Data
US 2013/0047044 A1 Feb. 21, 2013

Related U.S. Application Data

(60) Provisional application No. 61/525,437, filed on Aug. 19, 2011.

(51) Int. Cl.
*G06F 11/00* (2006.01)
*G11C 29/00* (2006.01)
*H03M 13/00* (2006.01)

(52) U.S. Cl.
USPC ............................ 714/708; 714/718; 714/758

(58) Field of Classification Search
USPC ............................ 714/704, 708, 718, 721, 758
See application file for complete search history.

(56) References Cited

U.S. PATENT DOCUMENTS

| 7,426,139 B2 * | 9/2008 | Ho et al. ................ 365/185.03 |
| 7,613,043 B2 * | 11/2009 | Cornwell et al. ........ 365/185.18 |
| 7,925,936 B1 * | 4/2011 | Sommer ...................... 714/704 |
| 8,036,044 B2 * | 10/2011 | Dong et al. .............. 365/185.29 |
| 8,145,984 B2 * | 3/2012 | Sommer et al. ................ 714/797 |
| 2011/0216590 A1 * | 9/2011 | Eun et al. .................. 365/185.03 |
| 2012/0239976 A1 * | 9/2012 | Cometti et al. ................. 714/24 |
| 2012/0240007 A1 * | 9/2012 | Barndt et al. ................. 714/758 |

OTHER PUBLICATIONS

Guiqiang Dong; Ningde Xie; Tong Zhang; , "Techniques for embracing intra-cell unbalanced bit error characteristics in MLC NAND flash memory," GLOBECOM Workshops (GC Wkshps), 2010 IEEE , vol., no., pp. 1915-1920, Dec. 6-10, 2010.*

Berman, A.; Birk, Y.; , "Constrained Flash memory programming," Information Theory Proceedings (ISIT), 2011 IEEE International Symposium on , vol., no., pp. 2128-2132, Jul. 31, 2011-Aug. 5, 2011.*

* cited by examiner

*Primary Examiner* — Cynthia Britt
(74) *Attorney, Agent, or Firm* — McDermott Will & Emery LLP

(57) ABSTRACT

The subject disclosure describes a method for reducing a sector error rate in a flash memory device, the method comprising, identifying a first program verify level having a first value, selecting an adjustment value for the first program verify level and programming the adjustment value to the first program verify level to replace the first value and to shift a first programming distribution associated with the first program verify level, wherein the shift in the first programming distribution is associated with a decrease in a sector error rate, wherein the shift in the first programming distribution is associated with an increase in a bit error rate. A flash storage device and computer-readable media are also provided.

23 Claims, 13 Drawing Sheets

800

--- select a plurality of program verify levels, wherein each of the program verify levels is associated with one or more programming levels of the flash memory device
(802)

--- adjust a first program verify level, of the plurality of program verify levels, to shift a first programming distribution associated with the first program verify level, wherein the shift in the first programming distribution is associated with a decrease in a sector error rate
(804)

--- adjusting a second program verify level, of the plurality of program verify levels, to shift a second programming distribution, wherein the shift in the second programming distribution is associated with an increase in a bit error rate
(806)

FIG. 8

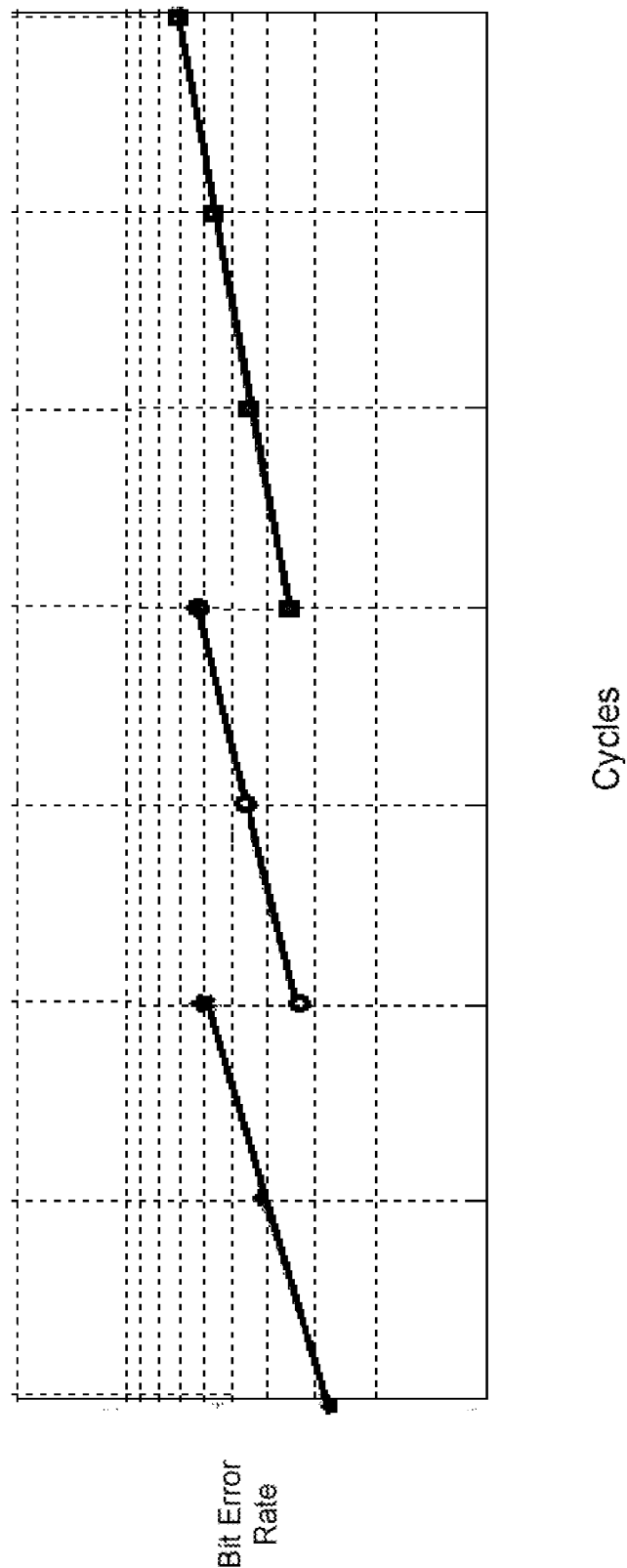

US 8,484,519 B2

OPTIMAL PROGRAMMING LEVELS FOR LDPC

This application claims the benefit of U.S. Provisional Application No. 61/525,437, filed Aug. 19, 2011, entitled "OPTIMAL PROGRAMMING LEVELS FOR LDPC," the entirety of which is incorporated herein by reference.

BACKGROUND

The subject disclosure relates to flash memory devices, such as solid-state drives (SSDs), that use flash memory to store data.

Over time, the cells of a flash memory device lose charge, which can cause the threshold voltage of flash memory cells to drop. The more program/erase cycles the device has experienced, the more extreme the decline in the threshold voltage. As the threshold voltage values drop in multi-level cell (MLC) flash memory, some of the cells programmed to the first level may fall below zero. Because read levels cannot be placed below zero, these programmed cells can be harder to decode. Eventually, errors originating from programmed cells that have drifted below zero volts can dominate the overall error rate of the device.

SUMMARY

In some aspects, the subject technology comprises a method for reducing a sector error rate in a flash memory device, the method comprising, identifying a first program verify level having a first value, selecting an adjustment value for the first program verify level and programming the adjustment value to the first program verify level to replace the first value and to shift a first programming distribution associated with the first program verify level, wherein the shift in the first programming distribution is associated with a decrease in a sector error rate, wherein the shift in the first programming distribution is associated with an increase in a bit error rate.

In other aspects, the subject technology comprises a flash storage device configured to adjust one or more program verify levels, for reducing a sector error rate, the flash storage device comprising, a flash memory array, an error correction module coupled to the flash memory array and a controller coupled to the error correction module and the flash memory array, wherein the controller is configured to perform operations comprising, identifying a first program verify level having a first value, selecting an adjustment value for the first program verify level and programming the adjustment value to the first program verify level to replace the first value and to shift a first programming distribution associated with the first program verify level, wherein the shift in the first programming distribution is associated with a decrease in a sector error rate, and wherein the shift in the first programming distribution is associated with an increase in a bit error rate.

The disclosed subject matter also relates to a computer-readable medium comprising instructions stored thereon, which when executed by a processor, cause the processor to perform operations comprising, identifying a first program verify level having a first value, selecting an adjustment value for the first program verify level and programming the adjustment value to the first program verify level to replace the first value. In certain aspects, the processor can be configured to perform operations to shift a first programming distribution associated with the first program verify level, wherein the shift in the first programming distribution is associated with a decrease in a sector error rate, and wherein the shift in the first programming distribution is associated with an increase in a bit error rate.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIG. 8 is a flow diagram of an example method for implementing certain aspects of the subject disclosure.

FIG. 9 graphically illustrates an example of a relationship between a number of program/erase cycles and a raw bit error rate, according to some aspects of the disclosure.

DETAILED DESCRIPTION

Figure 1:
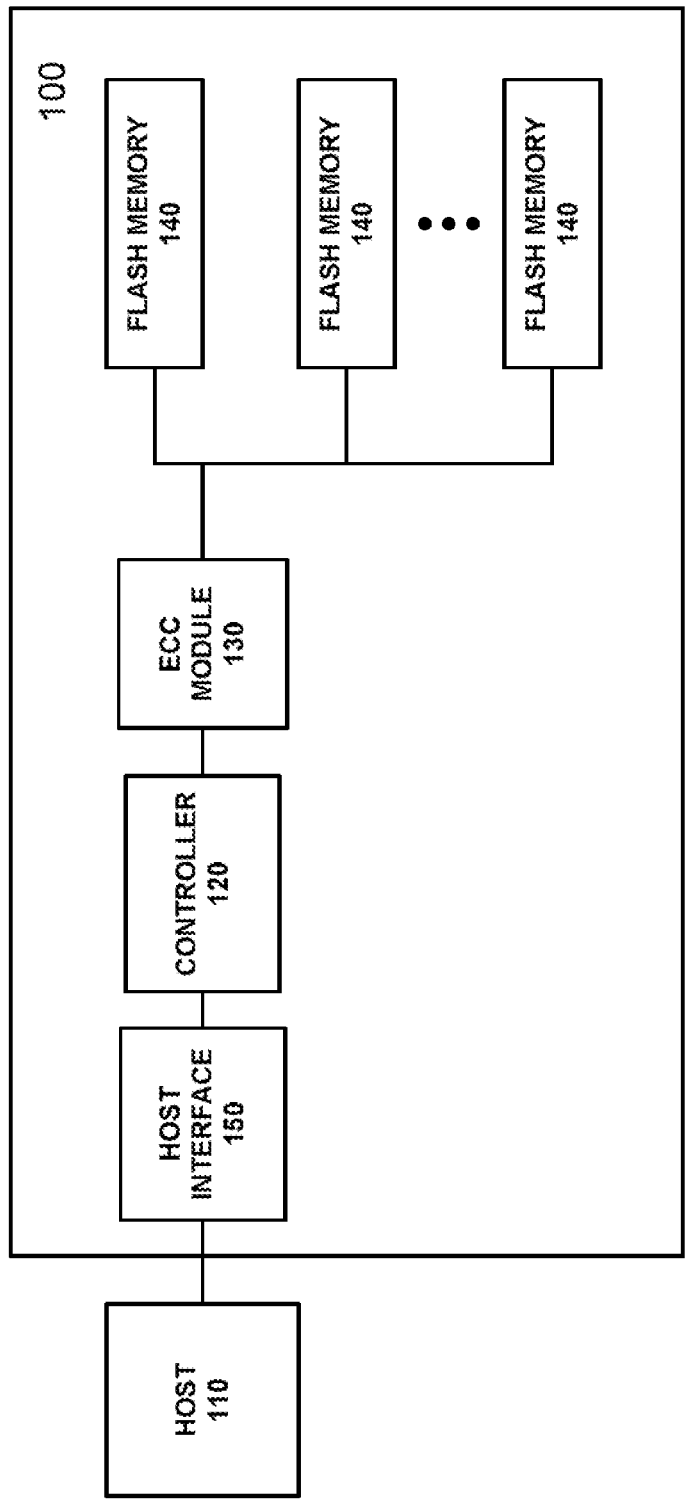
FIG. 1 is a block diagram illustrating components of a flash memory device according to one aspect of the subject disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical reference numbers for ease of understanding.

Individual flash cells in a flash memory device begin to deteriorate with time and use due to a number of causes, including, but not limited to, oxide degradation, exposure to heat and/or exposure to repeated program/erase cycles. Degradations of the device can lead to an increase in raw bit error rate (BER) for data read from the flash memory device. Raw bit errors can be detected and/or corrected using error correction decoding techniques, such as soft LDPC decoding. In some instances, not all raw bit errors are correctable using error correction decoding. As the number of uncorrectable raw bit errors increases, the number of sector errors of the flash device also increases. As used herein, a "sector error" can refer to a plurality of bits for which error correction cannot be performed e.g., using soft LDPC decoding. Although a "sector" can comprise any number of bits, in some implementations a sector can correspond with a codeword. Thus, a "sector error rate" can refer to a rate with which codewords read from a flash device cannot be decoded using soft LDPC decoding.

The subject technology addresses the above problems by providing a method and system for improving the performance of flash memory devices that use low-density parity-check (LDPC) error correction codes (ECC). Specifically, the subject technology provides a method for up-shifting the voltage distributions of one or more programming levels of a flash device by increasing the corresponding program verify voltage levels. In this manner, the voltages of programmed cells have further to fall before taking on negative voltage values e.g., before crossing the zero voltage threshold. The subject technology uses this technique to mitigate sector errors that are caused by programmed data voltages values that have dropped below zero volts. In some implementations, this technique can be used in devices that employ soft LDPC. While LDPC is identified as benefitting from this technique, other ECC solutions may gain similar advantages.

In some implementations of the technology, increases in sector error rate due to voltage drifts (e.g., of the L1 programming distribution) below zero volts, can be mitigated by up-shifting the voltage of the L1 programming distribution, for example, by increasing the corresponding L1 program verify level. However, increasing the voltage of the L1 programming distribution can lead to a greater overlap between the L1 programming distribution and the L2 programming distribution, resulting in an increase in raw BER for data read from L1 and L2. Similar increases in raw BER can occur for other programming levels that are similarly shifted. However, due to maximum voltage limitations of the flash chip, other programming levels (e.g., L2, L3, etc.) may not be able to be simply up-shifted by amounts equal to that of L1 in order to avoid overlap.

Accordingly, one aspect of the subject invention is to increase the program verify levels (and corresponding voltage distributions) for different programming levels in a manner that optimizes the tradeoff between reducing L1/L0 read errors and increasing errors for other programming levels such as L2/L1 and L3/L2 read errors. As discussed in further detail below, minimization of the overall sector error rate can be accomplished by increasing the program verify thresholds in a manner satisfying a constraint that the error rate probability for MSB page reads is equal to (or approximately equal to) the error rate probability for LSB page reads.

FIG. 1 is a block diagram illustrating components of a flash memory device 100 according to one aspect of the subject technology. As depicted in FIG. 1, a host 110 is coupled to the flash memory device 100 that includes a controller 120, ECC module 130, and an array of flash memory 140. The flash memory device 100 includes a host interface 150, coupled between the host 110 and the controller 120. Further depending on implementation, the elements of the flash memory device 100 can be integrated into a single chip or implemented in two or more discrete components.

The controller 120 can be implemented with a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on a ROM within the controller 120. One or more sequences of instructions also may be software stored and read from another storage medium, such as the flash memory array 140, or received from a host device (e.g., the host 110) via a host interface 150. ROM, storage mediums, and flash memory arrays represent examples of machine or computer readable media on which instructions/code executable by the controller. Machine or computer readable media may generally refer to any medium or media used to provide instructions to the controller 120, including both volatile media, such as dynamic memory used for storage media or for buffers within the controller 120, and non-volatile media, such as electronic media, optical media, and magnetic media.

The host interface 150 may be configured to implement a standard interface, such as Serial-Attached SCSI (SAS), Fiber Channel interface, PCI Express (PCIe), SATA, USB, and the like. The host interface 150 may be configured to implement only one interface. Alternatively, the host interface 150 may be configured to implement multiple interfaces, which are individually selectable using a configuration parameter selected by a user or programmed at the time of assembly. The host interface 150 can include one or more buffers for buffering transmissions between a host device and the controller. A host device (e.g., the host 110) may be any device configured to be coupled to the data storage system and to store data in data storage system. In some examples, the host device may be a computing system such as a personal computer, a server, a workstation, a laptop computer, PDA, smart phone, and the like. Alternatively, the host device may be an electronic device such as a digital camera, a digital audio player, a digital video recorder or the like.

The flash memory array 140 represents non-volatile memory devices for storing data. By way of example, the flash memory array 140 may comprise a single-level cell (SLC) memory, a multi-level cell (MLC) memory or an three-level cell (TLC) memory device. In some aspects, the flash memory array 140 may comprise one or more hybrid memory devices that can function in one or more of a SLC, MLC or TLC mode.

Each component of the flash memory array 140 may include a single flash memory device or chip, or may include multiple flash memory devices or chips arranged in multiple channels, as depicted in FIG. 1. However, the flash memory is not limited to any particular capacity or configuration. For example, the number of cell states, the number of physical blocks, the number of physical pages per physical block, the number of sectors per physical page, and the size of the sectors may vary within the scope of the subject technology.

One or more components of the flash memory array may contain one or more registers (not shown) for storing data used to control various memory management operations. For example, the registers may comprise data for modifying program verify levels, read levels, write operations and/or write operations, etc. In some implementations, the register data may be modified by the controller 120, in communication with the flash memory array 140.

The ECC module 130 represents one or more components configured to generate code words to be stored in the flash memory array from data received from a host and to decode code words read from the flash memory array before sending the decoded data to the host. According to one aspect of the subject technology, the ECC module 130 uses LDPC to encode and decode data to generate the code words. However, other ECC solutions may be used without departing from the scope of the subject technology.

Figure 2:
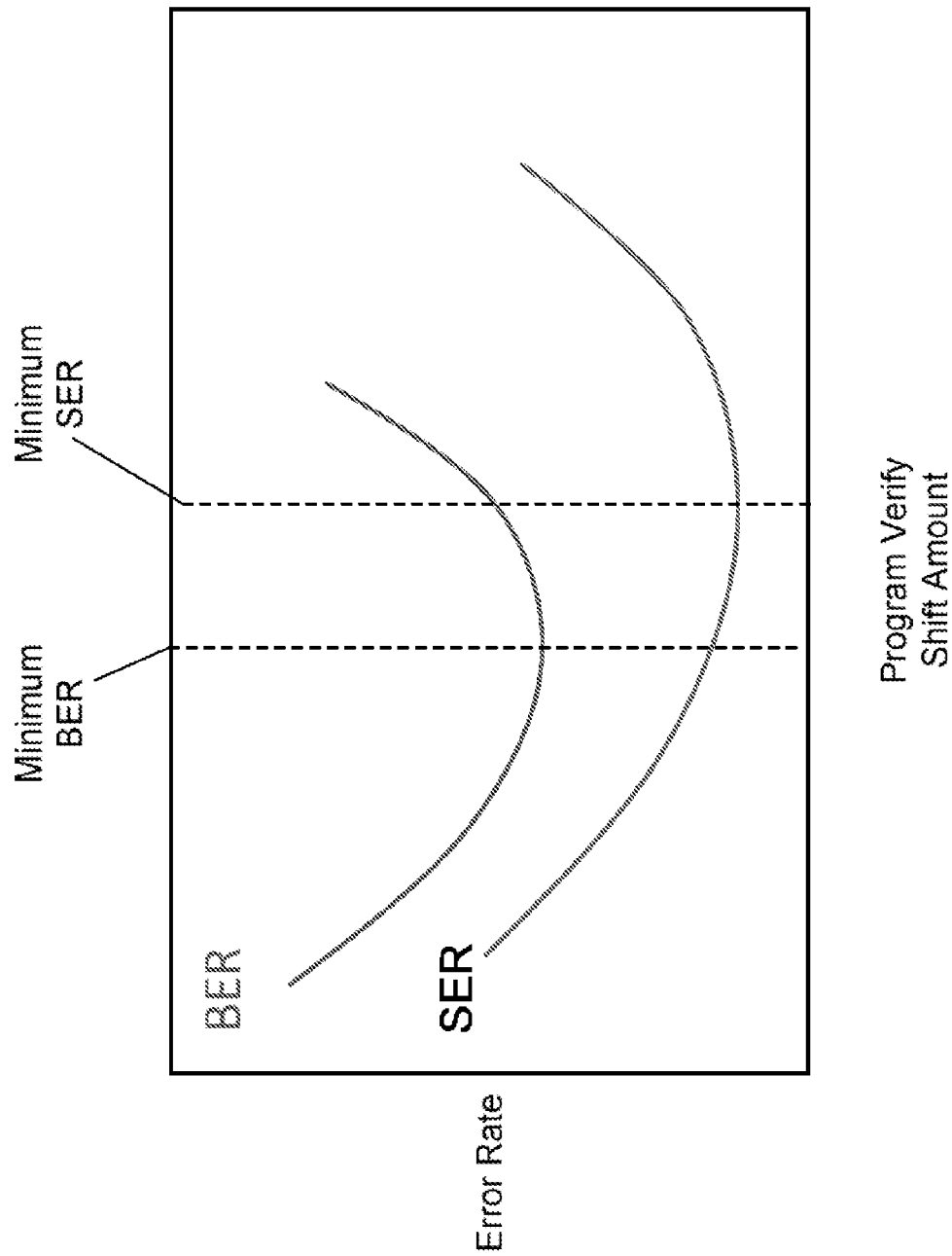
FIG. 2 is a graph illustrating an example of the relationship between a bit error rate (BER) and a sector error rate (SER), with respect to a program verify shift amount, according to some aspects of the disclosure.

FIG. 2 is a graph illustrating an example relationship between a raw bit error rate (BER) and a sector error rate (SER), with respect to a program verify shift amount. In certain regions of the graph, the curve representing the BER tracks the curve representing the SER. For example, both BER and SER curves show an initial reduction in respective error rate as the program verify shift amount is increased, until an error rate minimum for each respective curve is reached. However, because the BER and SER curves do not correspond perfectly, for some regions on the graph, increases in program verify shift amount may either (1) reduce both BER and SER; (2) increase BER, while reducing SER; or (3) increase both BER and SER.

Figure 3:
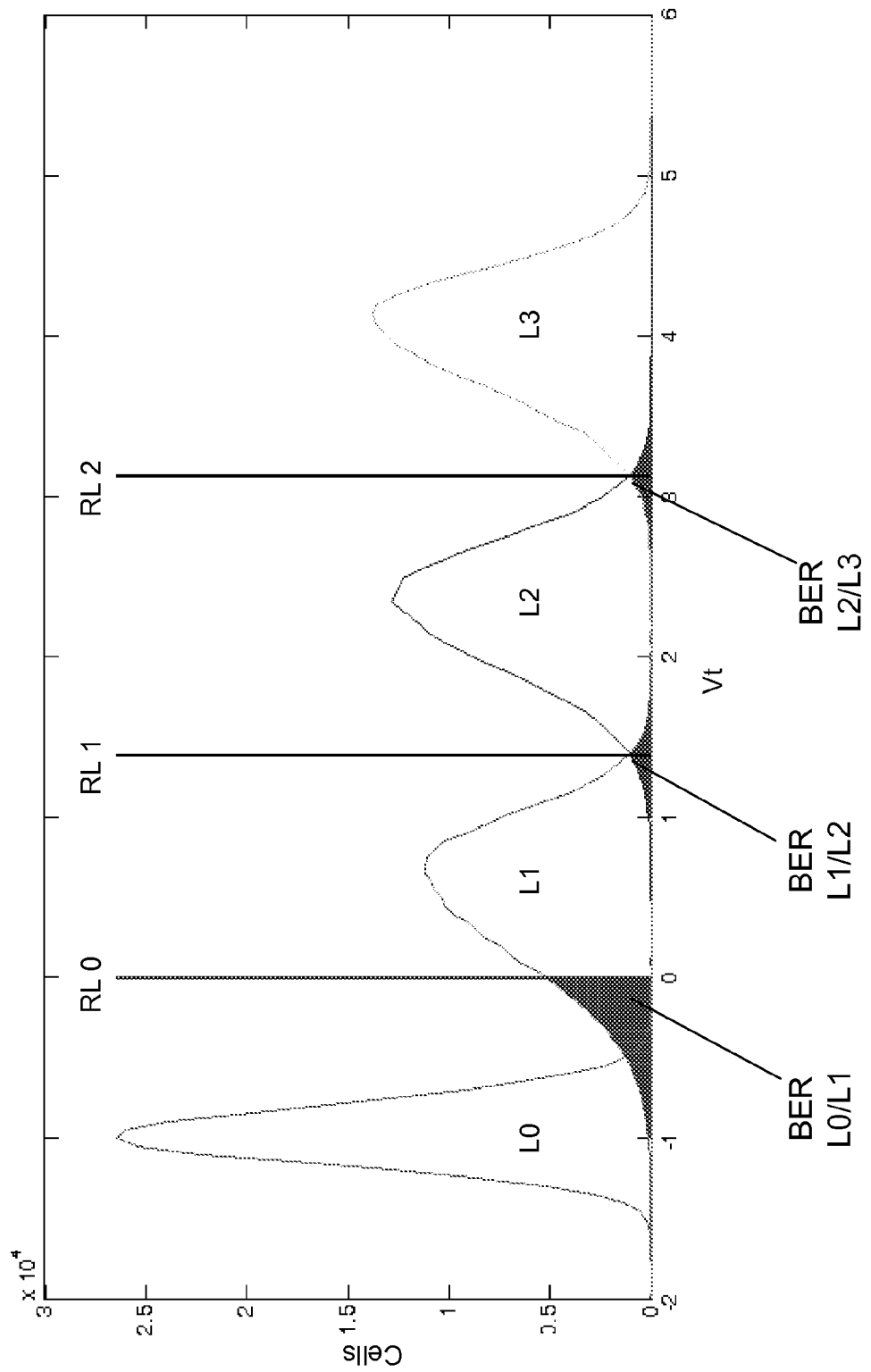
FIG. 3 is a graph illustrating an example of four programming levels for a MLC flash memory device, as well as the BER resulting from overlap among the programming levels, according to some aspects of the disclosure.

FIG. 3 is a graph illustrating an example of four programming levels for a MLC flash memory device as well as the BER resulting from overlap among the programming levels, where no shift has been introduced into the program verify levels. In the example illustrated in FIG. 3, the largest contribution to the total BER is made by the area defined as BER L0/L1, resulting from an area of the L1 programming level falling below the zero volt read level. Contributions to the overall BER are also made by BER L1/L2 and BER L2/L3, which indicate overlap between the L1/L2 and L2/L3 programming levels, respectively.

Figure 4:
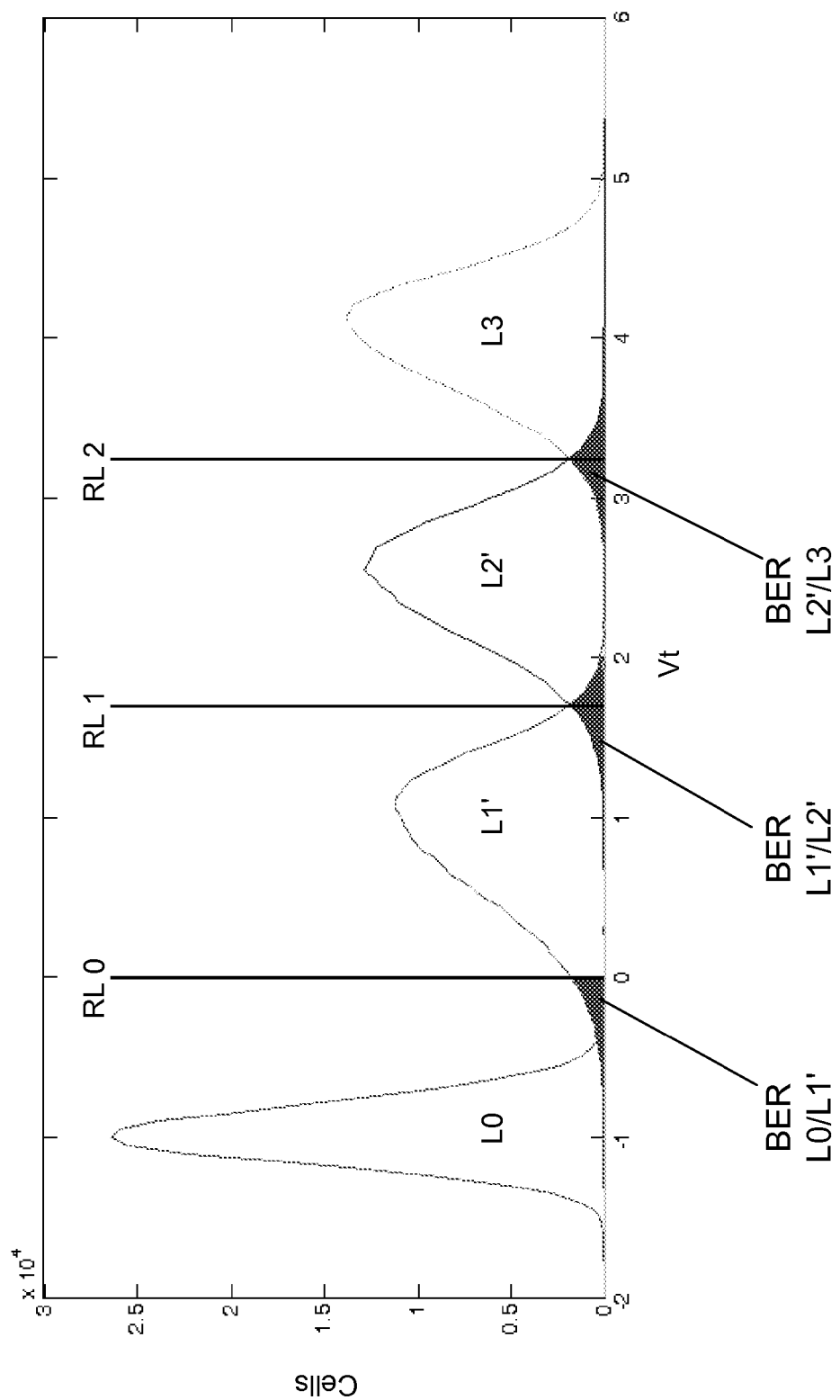
FIG. 4 is a graph illustrating an example of four programming levels for a MLC flash memory device, as well as the BER resulting from overlap among the programming levels, according to some aspects of the disclosure.

FIG. 4 is a graph illustrating an example of four programming levels for a MLC flash memory device as well as the BER resulting from overlap among the programming levels, where a shift has been introduced to the corresponding program verify levels. In the illustration of FIG. 4, the L1' and L2' programming levels represent the shifted L1 and L2 programming levels, respectively. Similarly, the BER L0/L1', BER L1'/L2' and BER L2'/L3 represent the BER contributions originating from portions of the L1' programming level that fall below zero volts, as well as originating from overlap between the L1'/L2' and L2'/L3 programming levels.

In comparing the examples of FIG. 3 and FIG. 4, it can be observed that the total BER is smaller in the example of FIG. 4, indicating that the overall BER can be decreased by shifting one or more of the programming levels (e.g., by up-shifting one or more program verify levels). For example, the decrease in BER caused by overlap between the L0/L1 programming levels is enough to offset the corresponding increase in BER due to overlap between the L1/L2 and L2/L3 programming levels. As a result, the net BER decreases due to shifts in programming levels L1 and L2. Additionally, although decreases in the BER can correspond with decreases in the SER, as will be discussed in further detail below, for some increases in program verify shift amount, the overall BER may increase, while the SER continues to decrease.

Figure 5:
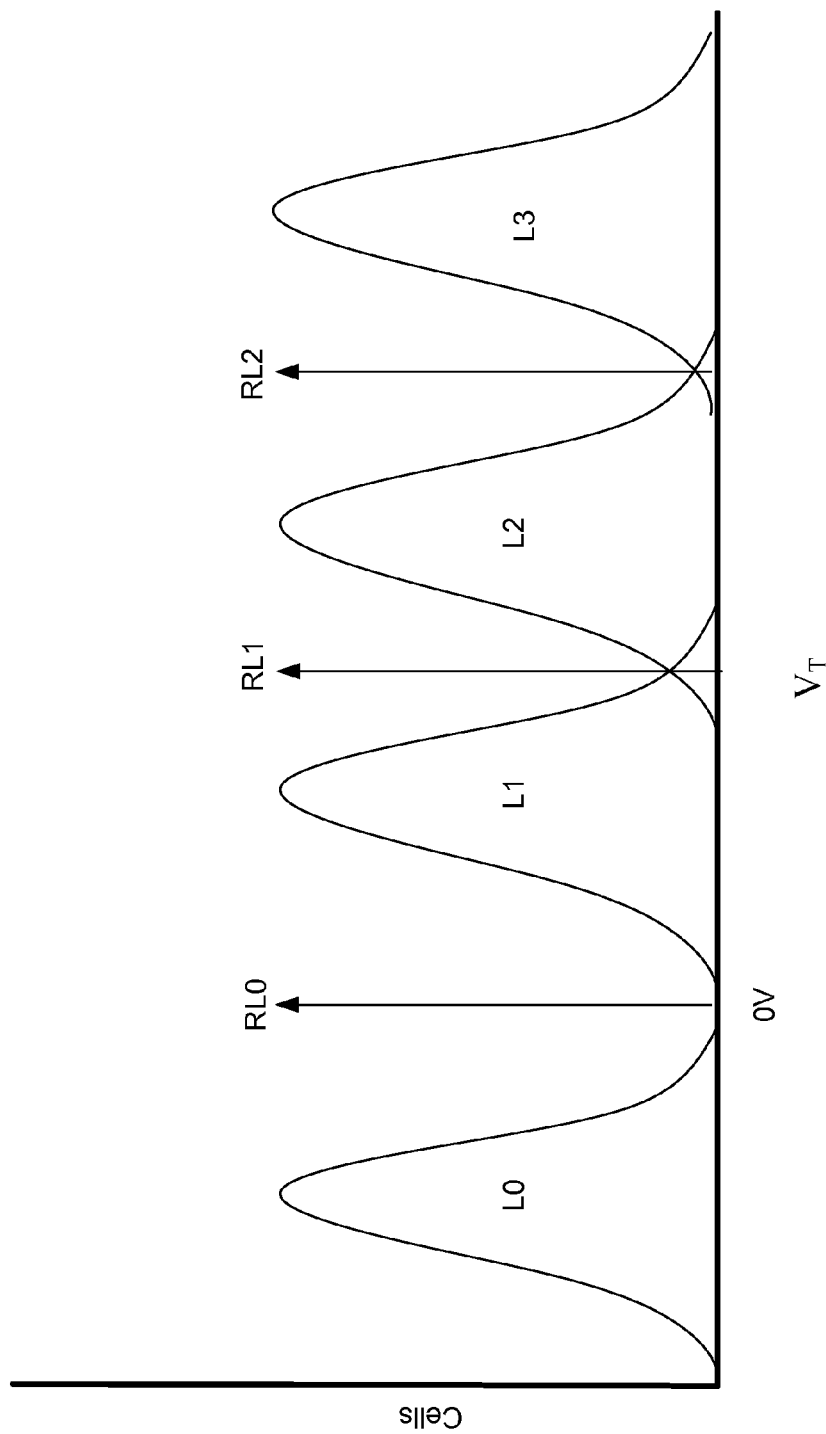
FIG. 5 a graph illustrating an example of four programming levels and associated read levels for a MLC flash memory device, according to one aspect of the subject disclosure.

FIG. 5 is an example of a graph of four programming levels and associated read levels for a MLC flash memory device. However, as mentioned above, although the example of FIG. 5 illustrates the programming levels of a MLC flash, the subject technology may be employed with flash devices a greater number of programmed states, such as TLC flash devices.

A MLC flash cell is capable of storing four levels of charge: an erased level, L0, and three programmed levels, L1, L2, and L3. These four levels yield two logical bits of information per cell, a Most Significant Bit (MSB) and a Least Significant Bit (LSB). In a group of cells, these two bits may make up corresponding MSB and LSB pages of a memory block. In some aspects, a NAND memory block is programmed using an Incremental Step Programming Procedure (ISSP) and erased using a similar Incremental Step Erase Procedure (ISEP). The memory cells that are to be programmed may be selected at the bit line, and a "page operation" can be performed to apply a voltage at the gates of each cell in the memory page. A corresponding selection at the bit lines creates a voltage potential in the selected group of memory cells where the LSB or MSB is selected to be different (for example, binary 01, 10 or 00) than the erased L0 distribution state (for example, binary 11).

As a flash memory is cycled (that is, programmed and erased), its physical qualities change. For example, the repeated placement and removal of electrons on the floating gate during programming and erase operations can cause electrons to be trapped in the device, and, when one or multiple cells are programmed, electrons may leak into neighboring cells after prolonged stress due to the voltages at the gates of neighboring cells. Such degradation in charge retention characteristics can lead to either an increase or decrease in the cell's conducting voltage e.g., by causing the threshold voltages of the memory cells to eventually take values that are different (higher or lower) than expected values. When the threshold voltage ($V_T$) of cells in a particular voltage distribution begin to cross to a lower read level, the likelihood of an erroneous read operation increases, resulting in an increase in the raw bit error rate (BER) for the flash device.

As the cells begin to degrade, the voltage distributions associated with the programming levels (e.g., L1, L2, L3, etc.) of the flash device, will begin to widen and/or drift. For example, in cases where flash cells of the L1 programming level begin to down-shift in voltage, an increasing number of L1 cells will cross below the 0 volt level. When read, the values of these cells are detected as "unprogrammed" e.g., belonging to programming level L0. Since many flash memories do not allow a read level to be placed below zero, less soft information is available for programming values falling below zero volts. As a result, degradation of L1 cells and the accompanying increase in L1/L0 read errors can disproportionally increase the sector error rate for the entire flash device. Consequently, the overall sector error rate of a degrading flash device will tend to be dominated by L1/L0 read errors.

Figure 6:
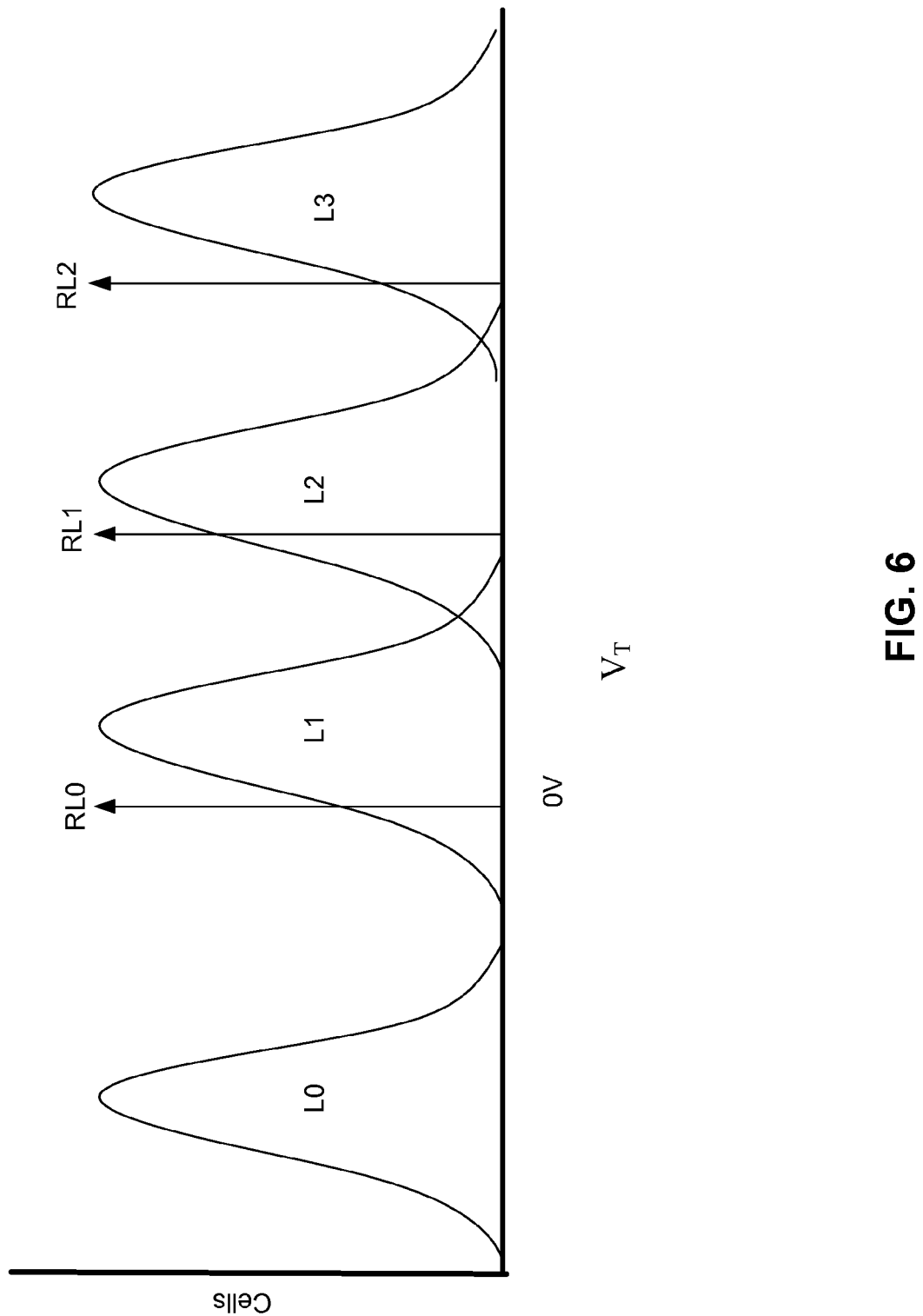
FIG. 6 illustrates an example of voltage drift for the programming levels and read levels shown in FIG. 5, according to some aspects of the subject disclosure.

FIG. 6 illustrates an example of voltage drift for the programming levels shown in FIG. 5. Actual voltage drift of the programming levels can vary with a number of erase/program cycles and/or an amount of time that charge has been stored on the flash device. By way of example, a device that has endured a greater number of erase/program cycles (e.g., 70 k cycles) may have a more significant voltage drift than would be experienced for a fewer number of erase/program cycles (e.g., 30 k cycles).

In the example depicted in FIG. 6, some of the threshold voltage values ($V_T$) in the L1 programming distribution have drifted below 0V. In certain aspects, the negative values of the L1 programming distribution will contribute disproportionately to the overall BER of the flash device because soft information for L1 values falling below 0 is harder to obtain due to the fact that read levels cannot be placed below 0 volts. The present technology provides a method to mitigate the BER associated with negative L1 values by up-shifting the voltages of the L1 and L2 programming distributions, for example, by increasing the program verify levels corresponding with the respective programming voltage distributions.

As illustrated in FIG. 2, incremental shifts in one or more programming distributions may have differing effects on the overall BER and SER. For example, referring again to FIG. 2, in the region of the graph between the Minimum BER and Minimum SER points, increases in the program verify shift amount correspond with increases in the BER and decreases in the SER. One aspect of the subject technology is to increment a program verify shift amount (corresponding with one or more programming levels) such that the SER for a flash device is minimized. As such, in some aspects, one or more program verify levels may be adjusted so as to increase the overall BER with the effect of lowering the overall SER for the flash device.

Figure 7A:
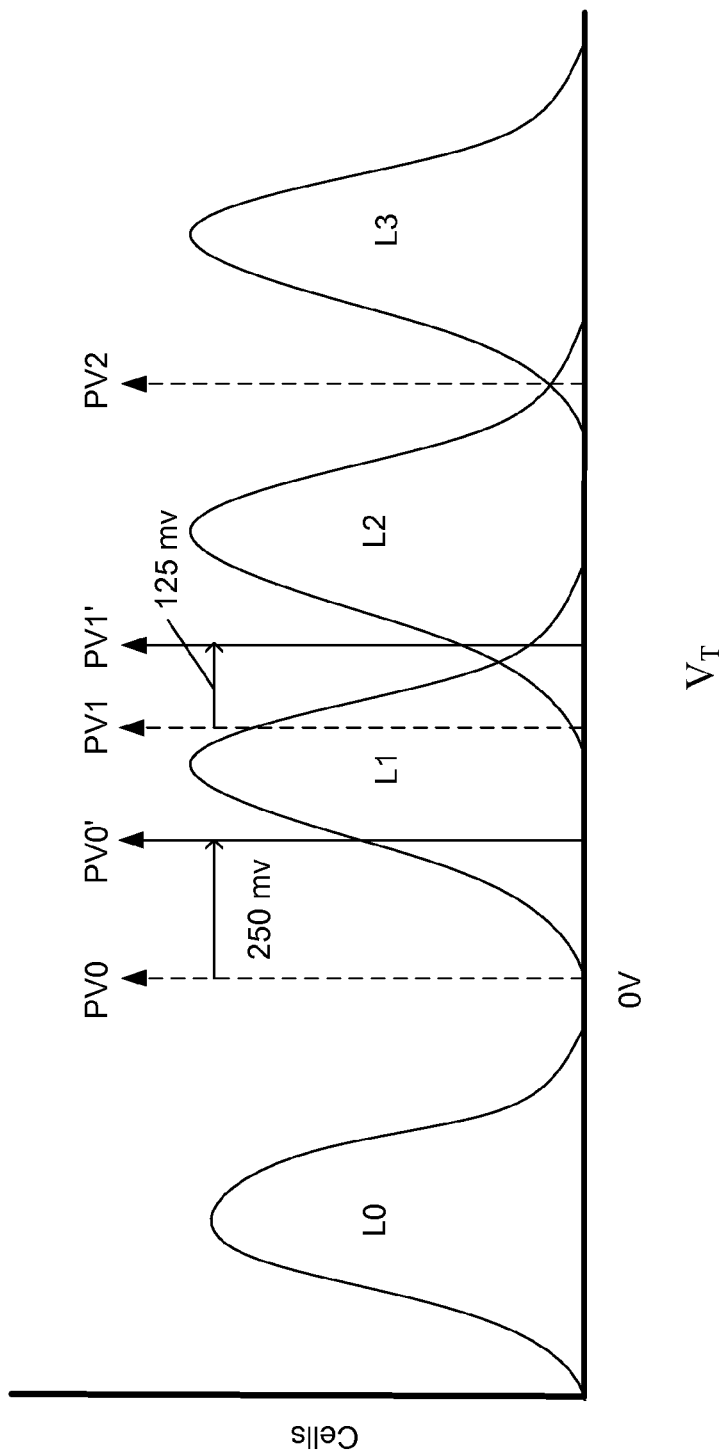
FIG. 7A illustrates an example of up-shifted read levels, according to some aspects of the subject disclosure.

FIG. 7A illustrates an example of up-shifted program verify levels. Specifically, FIG. 7A illustrates shifted program verify levels PV0' and PV1' that have been shifted from previous program verify levels, PV0 and PV1, respectively. Although, the voltage shift amounts for any of the program verify levels can vary depending on implementation, in the example of FIG. 7A, the program verify level associated with the L1 programming distribution (i.e., PV0') has been up-shifted by 250 mV. Furthermore PV1' has been shifted by 125 mV.

In certain aspects, shifting the PV0 program verify level (e.g., to cause corresponding shifts in the L1 programming distribution) can decrease the overall sector error rate of the device, for example, by reducing the number of errors resulting from $V_T$ values of L1 that would otherwise have drifted below 0V. However, up-shifting L1 programming distribution will also cause an increase in the overlap between the L1 and L2 distributions, leading to an increase in L2/L1 raw bit errors for data read from L2. For similar reasons, up-shifting the L2 distribution can increase the number of raw bit errors for data read from L3, as illustrated in FIG. 4, discussed above.

Figure 7B:
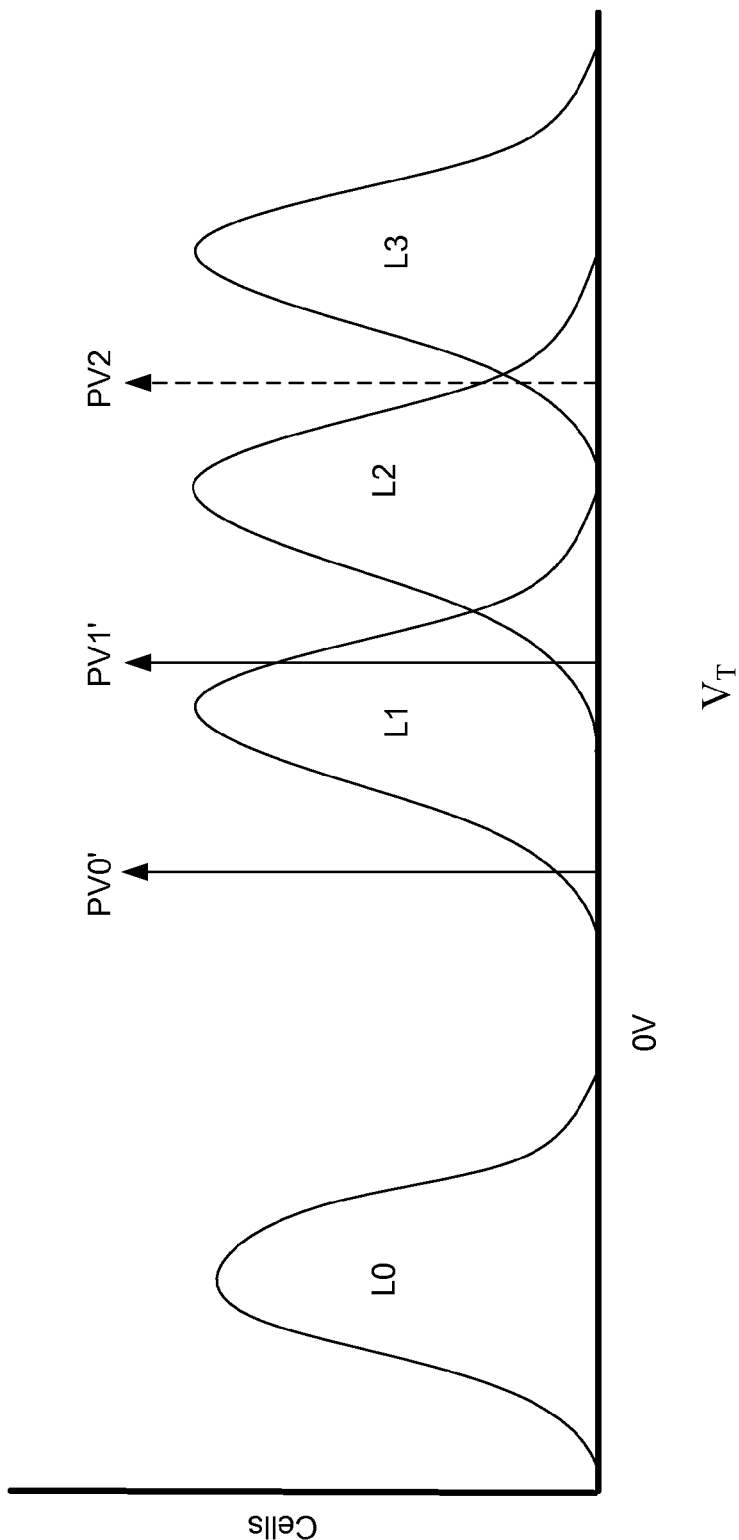
FIG. 7B illustrates an example of shifted programming levels, according to some aspects of the subject disclosure.

FIG. 7B illustrates an example of the overlap caused by up-shifting the L1 and L2 programming levels. However, although a net increase in the number of raw bit errors may be realized due to the increasing overlap of the L1/L2 and L2/L3 programming levels, up-shifting can reduce the overall sector error rate for the flash device, since errors originating from negative L1 values tend to contribute more heavily to the total number of sector errors.

Shifts to the program verify levels of L1 and L2 can cause the device to rely more heavily on the LDPC codes for correcting raw bit errors as the drive ages, but will delay the time in which the L1/L0 read errors dominate the operation and overwhelm the capabilities of the LDPC codes.

The amounts by which the L1 and L2 distributions are increased can be selected to re-balance error rates (e.g., the increase in raw bit error rate in comparison to the reduction in sector error rate). One method for determining the program verify levels for L1 and L2 is to minimize a cost function based on the decoding failure probabilities for the different levels. For example, the programming levels for L1 and L2 may be set to minimize the sum of decoding failure probabilities between L1 and L0, between L2 and L1, and between L3 and L2. Other cost functions can seek to balance the probability of a read error in the MSB pages with that of LSB pages. In other aspects, cost functions can be used to redistribute errors in order to extend the useful life of the flash memory device.

The adjustments to the programming levels for L1 and L2 can be evaluated and refined using simulations and/or experimental results for different flash memory models and manufacturers. Different sets of adjustments for the L1 and L2 programming levels can also be identified and stored in the flash memory device for the controller to access at different stages of device life. For example, different sets of adjustments may be used at different P/E cycle counts and/or based on a measure of total raw bit error rate (BER) for the flash device. In certain aspects, the controller can set the adjustments as the devices reach one or more thresholds in P/E cycle and/or overall BER counts. Different sets of adjustments can be made for different error rates experienced by the device, e.g., errors associated with specific programming levels.

In certain implementations, characteristics of one or more chips of flash memory 140 can be controlled and/or adjusted based on values stored to registers on one or more chips of the flash memory 140. Thus, various characteristics of the flash memory 140 can be set and/or re-set by programming (or re-programming) the values of one or more registers of one or more chips of the flash memory 140 in the flash memory device 100. The controller 120 can be configured to set and/or adjust one or more program verify voltage levels for one or more chips of the flash memory 140 by programming and/or re-programming one or more registers on the flash device 100. In some implementations, the controller can be configured to adjust program verify levels across an entire array of flash memory 140, or on a chip by chip basis. As such, the program verify levels for any given chip can be adjusted by the controller, based on characteristics unique to that particular chip.

For example, the controller may use a new set of adjustments when the error rates reach different respective thresholds for a particular chip. In another alternative, different adjustments can be used as the program times vary. The controller may use a new set of adjustments as the program times reach new respective thresholds.

FIG. 8 is a flow diagram of an example method 800 for implementing certain aspects of the subject disclosure. The method begins with step 802 in which a plurality of program verify levels are selected and wherein each of the program verify levels is associated with one or more programming levels of a flash memory device. In some aspects, the memory device will comprise MLC flash having four programming levels, i.e., an erase state (e.g., L0) and three programmed states (e.g., L1, L2 and L3); however, other flash configurations can comprise a greater number of programming levels, depending on implementation.

In step 804, a first program verify level, of the plurality of program verify levels, is adjusted in order to shift a first programming distribution (associated with the first program verify level), wherein the shift in the first programming distribution is associated with a decrease in a sector error rate. Referring to the example illustrated in FIG. 7A, the first program verify level corresponds with PV0, wherein the shifted value of the first program verify level corresponds with PV0.' By increasing PV0 to PV0,' the voltage distribution for flash cells corresponding to the first programming distribution (e.g., L1) can be increased.

In certain aspects, up-shifting the L1 programming level (e.g., by PV0') will cause a greater amount of overlap between the voltages of cells in the L1 programming level and those of the L2 programming level. As a result, the error rate for data read from L2 may increase (e.g., a greater amount of overlap between L1 and L2 may increase the raw bit error rate).

In step 806, a second program verify level is adjusted to shift a second programming distribution (associated with the second program verify level), wherein the shift in the second programming distribution also associated with an increase a raw bit error rate, for example, due to an increasing amount of overlap between the L2 and L3 programming distributions. Using the above example, the second program verify level can correspond with PV1, which is adjusted to PV1' (see FIG. 7A). The increase in the raw bit error rate corresponds with an increase L2 and L3 errors caused, in part, by the increased overlap between L2 and L3. Due to maximal voltage limitations of the flash device (e.g., limitations on maximal flash cell voltage), the L2 programming level may be shifted by a voltage amount smaller than PV0.' For example, in the embodiment discussed above with respect to FIGS. 7A and 7B, PV0'>(PV1'−PV1).

Although the raw bit error rate (BER) for data read from programming levels L2 and L3 may increase as the L1 and L2 programming distributions are up-shifted, the reduction of the sector error rate due to up-shifting the L1 programming level can be enough to offset the increases in BER caused by the increasing overlap between the L1/L2 and L2/L3 programming levels. For example, L1 values that would have shifted below the zero voltage point if not for voltage shifts to L1, will be returned to positive voltage values (e.g., by up-shifting the corresponding program verify level) and are more likely to be recovered using soft decoding techniques. The tradeoff in reducing the number of errors resulting from negative L1 voltage values, in exchange for increasing the BER due to increasing overlap between L1/L2 and L2/L3, can reduce the overall sector error rate of the flash device.

Although the voltage shifts chosen for any particular programming level can vary depending on implementation, in certain aspects the amounts by which the programming levels are up-shifted will be chosen to satisfy the constraint that the total BER originating from LSB page reads should be equal to (or approximately equal to), the total BER for MSB page reads.

Although, shifts in program verify levels (e.g., to cause corresponding shifts in the respective programming levels) can be performed based on any criteria, in some implementations, program verify levels will be adjusted based on a total BER measured for the flash device and/or based on a total BER measured for one or more programming levels. In another example, shifts in program verify levels can be based on a measure of the number of program/erase cycles experience by the flash device and/or may be based on experimental data collected for a particular flash device.

FIG. 9 graphically illustrates an example of a relationship between a number of program/erase cycles and a bit error rate (e.g., a raw bit error rate). Specifically, FIG. 9 illustrates three cases. In the first case (denoted with a square shape), a read level has no limitation i.e., the read level is not restricted to non-negative values and the programming levels have no voltage offset. In the second case (denoted with a circle shape), the read level is set to a zero limit (e.g., the read level cannot be set below zero volts) and the programming levels are given a voltage offset. In the third case (denoted with a star shape), a read level is set to a zero limit (e.g., the read level cannot be set below zero volts) and the programming levels are given no voltage offset.

As shown in FIG. 9, in all three cases the bit error rate increases as the number of program/erase cycles is increased. However, the case having an unrestricted read level can endure a greater number of cycles before reaching a bit error rate that is comparable to the other two cases.

For the case having a zero limit and a programming level offset (denoted with a circle shape), a higher number of cycles are endured before reaching bit error rates that are comparable to the case having a zero voltage read level and no programming level offset (denoted with a star shape). As such, the example illustrated in FIG. 9 demonstrates that a programming level offset can increase the number of cycles that can be endured before reaching comparable bit error rates when compared to implementations having no programming level offset.

Figure 10:
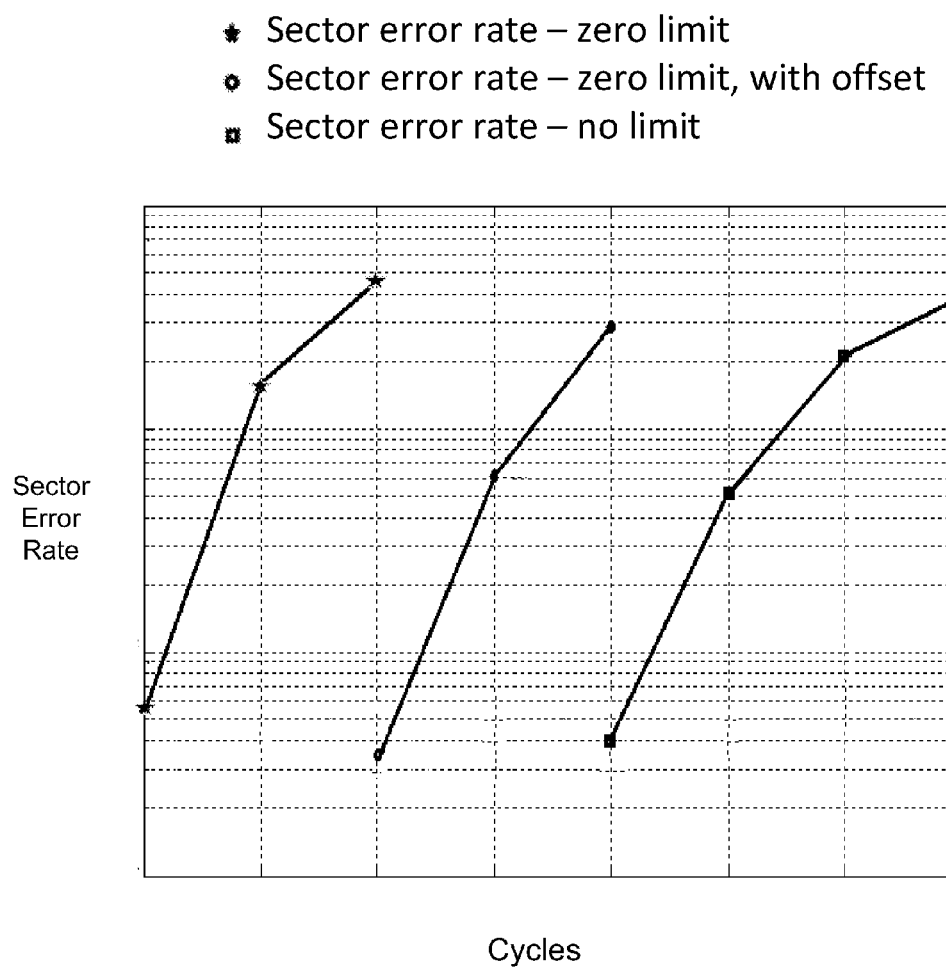
FIG. 10 graphically illustrates an example of a relationship between a number of program/erase cycles and a sector error rate, according to some aspects of the disclosure.

FIG. 10 graphically illustrates an example of a relationship between a number of program/erase cycles and a sector error rate. Specifically, FIG. 10 illustrates three sector error rate examples that are complimentary to the examples discussed above with respect to FIG. 9. In the first case, (denoted with a square shape), a read level has no limitation (i.e., can be set below zero volts), and the programming levels have zero voltage offset. In the second case (denoted with a circle shape), the read level is set to a zero voltage limit and the programming levels have been offset. In the third case (denoted with a star shape), the read level is set to a zero voltage limit and the programming levels have no voltage offset.

The results illustrated by FIG. 10 are congruent with those illustrated above with respect to the bit error rate in FIG. 9. That is, (for the same sector error rates) an implementation having no read level limit enables the device to endure a greater number of cycles (e.g., see curve denoted by circle shape). However, in cases where the read level is set to zero volts (e.g., a zero limit) and again assuming an equal sector error rate, implementations having a programming level offset enable the device to endure a greater number of cycles before reaching the point of failure.

Figure 11:
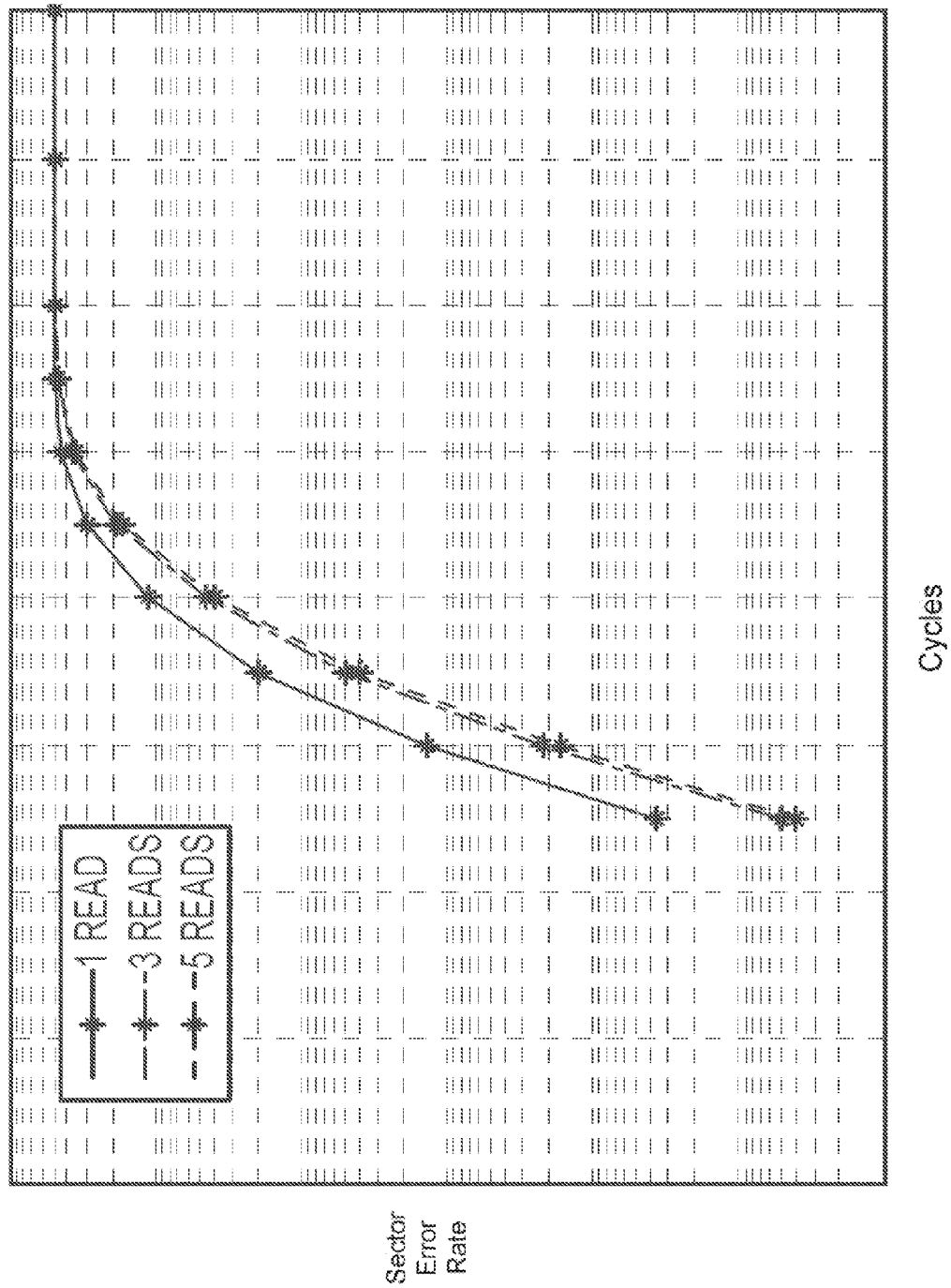
FIG. 11 graphically illustrates an example of a relationship between a number of program/erase cycles and an error rate for a various number of reads, wherein read levels are non-negative and programming levels are not shifted.

FIG. 11 graphically illustrates an example of a relationship between a number of program/erase cycles and a sector error rate for a various number of reads, wherein read levels are non-negative and programming levels are not shifted. As generally illustrated in the example of FIG. 11, the sector error rate for all reads increases as the number of program/erase cycles increases. As further illustrated in FIG. 11, a greater number of reads corresponds with a reduction in the overall sector error rate. For example, the curve illustrating 5 reads generally has a lower sector error rate (for comparable cycle counts) as compared to the curves illustrating 3 reads and 1 read, respectively.

Figure 12:
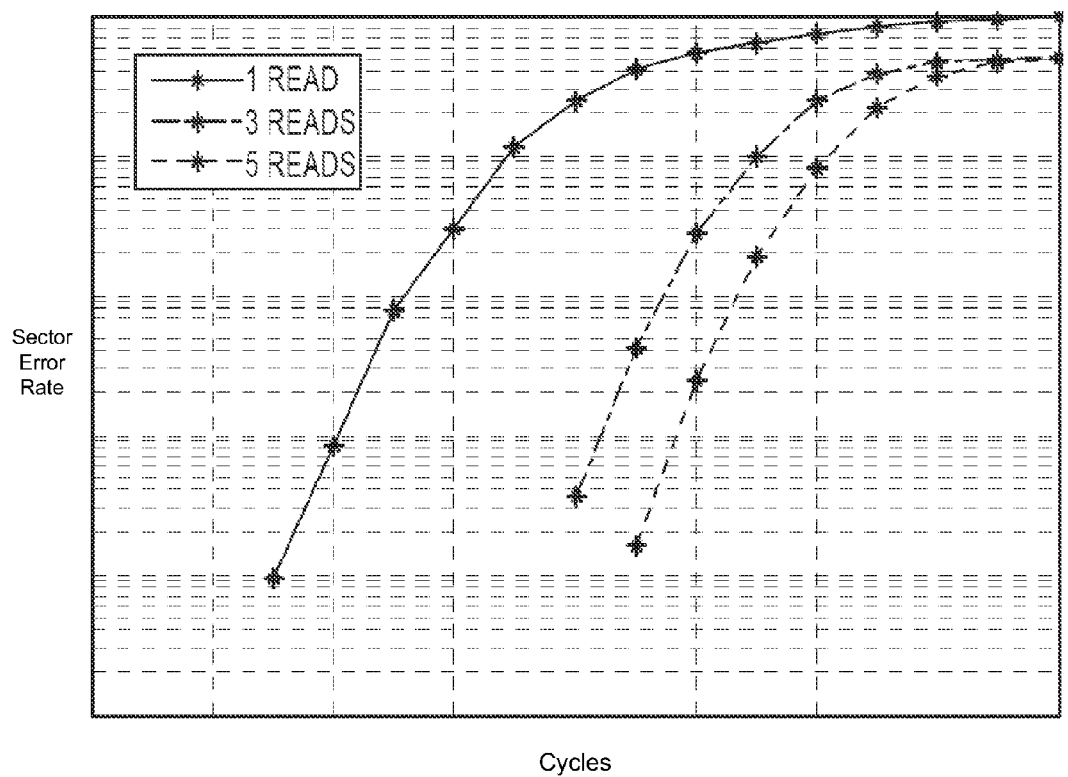
FIG. 12 graphically illustrates an example of a relationship between a number of program/erase cycles and an error rate for a various number of reads, wherein read levels are non-negative and programming levels have been shifted.

FIG. 12 graphically illustrates an example of a relationship between a number of program/erase cycles and a sector error rate for a various number of reads, wherein read levels are non-negative and programming levels have been shifted. As compared to the curves illustrated in FIG. 11 (having no programming level offset), the graph of FIG. 12 demonstrates that greater gains are yielded for an increasing number of reads in implementations having a programming level offset. For example, in the illustration of FIG. 12, there is a greater disparity in sector error rate as between the curves representing 5 reads and the curve representing 1 read, as compared to complimentary curves illustrated in FIG. 11, wherein no programming level offset is implemented.

As such, the examples of FIGS. 11 and 12 illustrated that greater performance gains (e.g., greater reductions in sector error rate) can be accomplished in implementations wherein programming levels have been shifted.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method for reducing a sector error rate in a flash memory device, the method comprising:
   identifying a first program verify voltage level having a first value;
   selecting an adjustment value for the first program verify voltage level; and
   programming the adjustment value to the first program verify voltage level to replace the first value and to shift a first programming distribution associated with the first program verify voltage level, wherein the shift in the first programming distribution is associated with a decrease in a sector error rate, and
   wherein the shift in the first programming distribution is associated with an increase in a bit error rate.

2. The method of claim 1, further comprising:
   identifying a second program verify voltage level having a second value;
   selecting a second adjustment value for the second program verify voltage level; and
   programming the second adjustment value to the second program verify voltage level to replace the second value and to shift the second programming distribution, wherein the shift in the second programming distribution is associated with an increase in the bit error rate.

3. The method of claim 2, wherein selecting an adjustment value for the first program verify voltage level and selecting an adjustment value for the second program verify voltage level is performed such that a MSB error rate and a LSB error rate of the flash memory device are equal.

4. The method of claim 2, wherein selecting an adjustment value for the first program verify voltage level and selecting an adjustment value for the second program verify voltage level further comprises:
   determining a first voltage shift amount corresponding with the first programming distribution; and
   determining a second voltage shift amount corresponding with the second programming distribution, wherein the second voltage shift amount is different from the first voltage shift amount.

5. The method of claim 1, wherein the decrease in the sector error rate corresponds with a decrease in a LSB error rate.

6. The method of claim 1, wherein selecting an adjustment value for the first program verify voltage level is performed based on a number of erase/programming cycles of the flash memory device.

7. The method of claim 1, wherein selecting an adjustment value for the first program verify voltage level is performed based on a bit error rate of the flash memory device.

8. A flash storage device configured to adjust one or more program verify voltage levels, for reducing a sector error rate, the flash storage device comprising:
   a flash memory array;
   an error correction module coupled to the flash memory array; and a controller coupled to the error correction module and the flash memory array, wherein the controller is configured to perform operations comprising:

identifying a first program verify voltage level having a first value;

selecting an adjustment value for the first program verify voltage level; and programming the adjustment value to the first program verify voltage level to replace the first value and to shift a first programming distribution associated with the first program verify voltage level, wherein the shift in the first programming distribution is associated with a decrease in a sector error rate, and wherein the shift in the first programming distribution is associated with an increase in a bit error rate.

9. The flash storage device of claim 8, further comprising:

identifying a second program verify voltage level having a second value;

selecting a second adjustment value for the second program verify voltage level; and programming the second adjustment value to the second program verify voltage level to replace the second value to shift the second programming distribution, wherein the shift in the second programming distribution is associated with an increase in the bit error rate.

10. The flash storage device of claim 9, wherein selecting an adjustment value for the first program verify voltage level and selecting an adjustment value for the second program verify voltage level is performed such that a MSB error rate and a LSB error rate of the flash memory device are equal.

11. The flash storage device of claim 9, wherein selecting an adjustment value for the first program verify voltage level and selecting an adjustment value for the second program verify voltage level further comprises:

determining a first voltage shift amount corresponding with the first programming distribution; and determining a second voltage shift amount corresponding with the second programming distribution, wherein the second voltage shift amount is different from the first voltage shift amount.

12. The flash storage device of claim 8, wherein the decrease in the sector error rate corresponds with a decrease in a LSB error rate.

13. The flash storage device of claim 8, wherein selecting an adjustment value for the first program verify voltage level is performed based on a number of erase/programming cycles of the flash memory device.

14. The flash storage device of claim 8, wherein selecting an adjustment value for the first program verify voltage level is performed based on a bit error rate of the flash memory device.

15. A non-transitory computer-readable medium comprising instructions stored thereon, which when executed by a processor, cause the processor to perform operations comprising:

identifying a first program verify voltage level having a first value;

selecting an adjustment value for the first program verify voltage level; and programming the adjustment value to the first program verify voltage level to replace the first value and to shift a first programming distribution associated with the first program verify voltage level, wherein the shift in the first programming distribution is associated with a decrease in a sector error rate, and wherein the shift in the first programming distribution is associated with an increase in a bit error rate.

16. The non-transitory computer-readable medium of claim 15, further comprising:

identifying a second program verify voltage level having a second value;

selecting a second adjustment value for the second program verify voltage level; and programming the second adjustment value to the second program verify voltage level to replace the second value and to shift the second programming distribution, wherein the shift in the second programming distribution is associated with an increase in the bit error rate.

17. The non-transitory computer-readable medium of claim 16, wherein selecting an adjustment value for the first program verify voltage level and the second program verify voltage level is performed such that a MSB error rate and a LSB error rate of the flash memory device are equal.

18. The non-transitory computer-readable medium of claim 16, wherein selecting the adjustment value for the first program verify voltage level and the second program verify voltage level further comprises:

determining a first voltage shift amount corresponding with the first programming distribution; and determining a second voltage shift amount corresponding with the second programming distribution, wherein the second voltage shift amount is different from the first voltage shift amount.

19. The non-transitory computer-readable medium of claim 15, wherein the decrease in the sector error rate corresponds with a decrease in a LSB error rate.

20. The non-transitory computer-readable medium of claim 15, wherein selecting an adjustment value for the first program verify voltage level is performed based on a number of erase/programming cycles of the flash memory device.

21. The non-transitory computer-readable medium of claim 15, wherein selecting an adjustment value for the first program verify voltage level is performed based on a bit error rate of the flash memory device.

22. A method for reducing a sector error rate in a flash memory device, the method comprising:

identifying a plurality of program verify voltage levels set in the flash memory device, wherein each of the program verify voltage levels is associated with one or more programming levels of the flash memory device;

adjusting a first program verify voltage level of the plurality of program verify voltage levels in the flash memory device to shift a first programming distribution, wherein adjusting the first program verify voltage level is associated with a decrease in a first bit error rate; and adjusting a second program verify voltage level of the plurality of program verify voltage levels in the flash memory device to shift a second programming distribution, wherein adjusting the second program verify voltage level is associated with an increase in a second bit error rate, and wherein adjusting the first program verify voltage level and adjusting the second program verify voltage level are associated with an overall decrease in a bit error rate for the flash memory device.

23. The method of claim 22, wherein adjusting the first program verify voltage level and adjusting the second program verify voltage level are associated with a decrease in a sector error rate for the flash memory device.

* * * * *